(12) United States Patent
Hwang et al.

(10) Patent No.: US 12,345,771 B2
(45) Date of Patent: Jul. 1, 2025

(54) APPARATUS AND METHOD FOR DETERMINING DEFECT OF BATTERY CELL

(71) Applicant: SK ON CO., LTD., Seoul (KR)

(72) Inventors: Chang Mook Hwang, Daejeon (KR); Jong Hyuk Lee, Daejeon (KR); Yoon Ji Jo, Daejeon (KR)

(73) Assignee: SK ON CO., LTD., Seoul (KR)

(*) Notice: Subject to any disclaimer, the term of this patent is extended or adjusted under 35 U.S.C. 154(b) by 148 days.

(21) Appl. No.: 18/192,648

(22) Filed: Mar. 30, 2023

(65) Prior Publication Data

US 2023/0324470 A1 Oct. 12, 2023

(30) Foreign Application Priority Data

Apr. 6, 2022 (KR) .................. 10-2022-0043029

(51) Int. Cl.
*G01R 31/392* (2019.01)
*G01R 31/374* (2019.01)
*G01R 31/385* (2019.01)
*G01R 31/388* (2019.01)

(52) U.S. Cl.
CPC ......... *G01R 31/392* (2019.01); *G01R 31/374* (2019.01); *G01R 31/3865* (2019.01); *G01R 31/388* (2019.01)

(58) Field of Classification Search
None
See application file for complete search history.

(56) References Cited

U.S. PATENT DOCUMENTS

| | | | | |
|---|---|---|---|---|
| 2002/0113595 A1* | 8/2002 | Sakai | .................. | B60W 10/26 903/903 |
| 2013/0144547 A1* | 6/2013 | Yun | ...................... | G01R 31/367 702/63 |
| 2020/0081066 A1* | 3/2020 | Ahn | ...................... | G01R 31/389 |
| 2020/0348364 A1* | 11/2020 | Guo | ...................... | G01R 31/367 |
| 2023/0084079 A1* | 3/2023 | Kwak | ................. | G01R 31/392 324/432 |
| 2024/0288501 A1* | 8/2024 | Crymble | ............. | G01R 31/382 |

FOREIGN PATENT DOCUMENTS

| | | |
|---|---|---|
| KR | 10-1779187 B1 | 9/2017 |
| KR | 10-2018-0081009 A | 7/2018 |
| KR | 10-2043645 B1 | 12/2019 |
| KR | 10-2064459 B1 | 1/2020 |
| KR | 10-2021-0066096 A | 6/2021 |

\* cited by examiner

*Primary Examiner* — Jas A Sanghera
(74) *Attorney, Agent, or Firm* — IP & T GROUP LLP

(57) ABSTRACT

An apparatus and a method for determining a defect of a battery cell are disclosed. The defect determination apparatus according to an aspect includes: a temperature measurement unit configured to measure an aging temperature of the battery cell; a period determination unit configured to determine an aging period of the battery cell; an SOC determination unit configured to measure and determine a state of charge (SOC) of the battery cell at the start of aging; a voltage measurement unit configured to measure open circuit voltages (OCVs) of the battery cell at the start of aging and at the end of aging; and a defect determination unit configured to determine whether the battery cell is defective based on the aging temperature, the aging period, the SOC at the start of aging, the OCV at the start of aging and the OCV at the end of aging.

15 Claims, 2 Drawing Sheets

[FIG. 1]
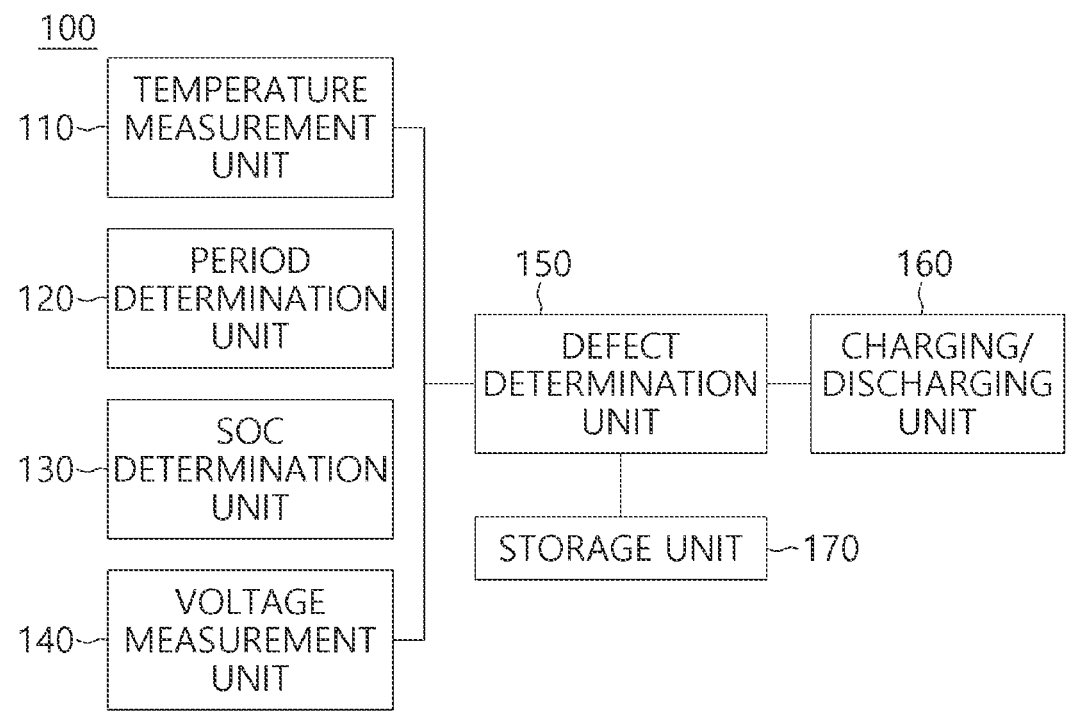

[FIG. 2]
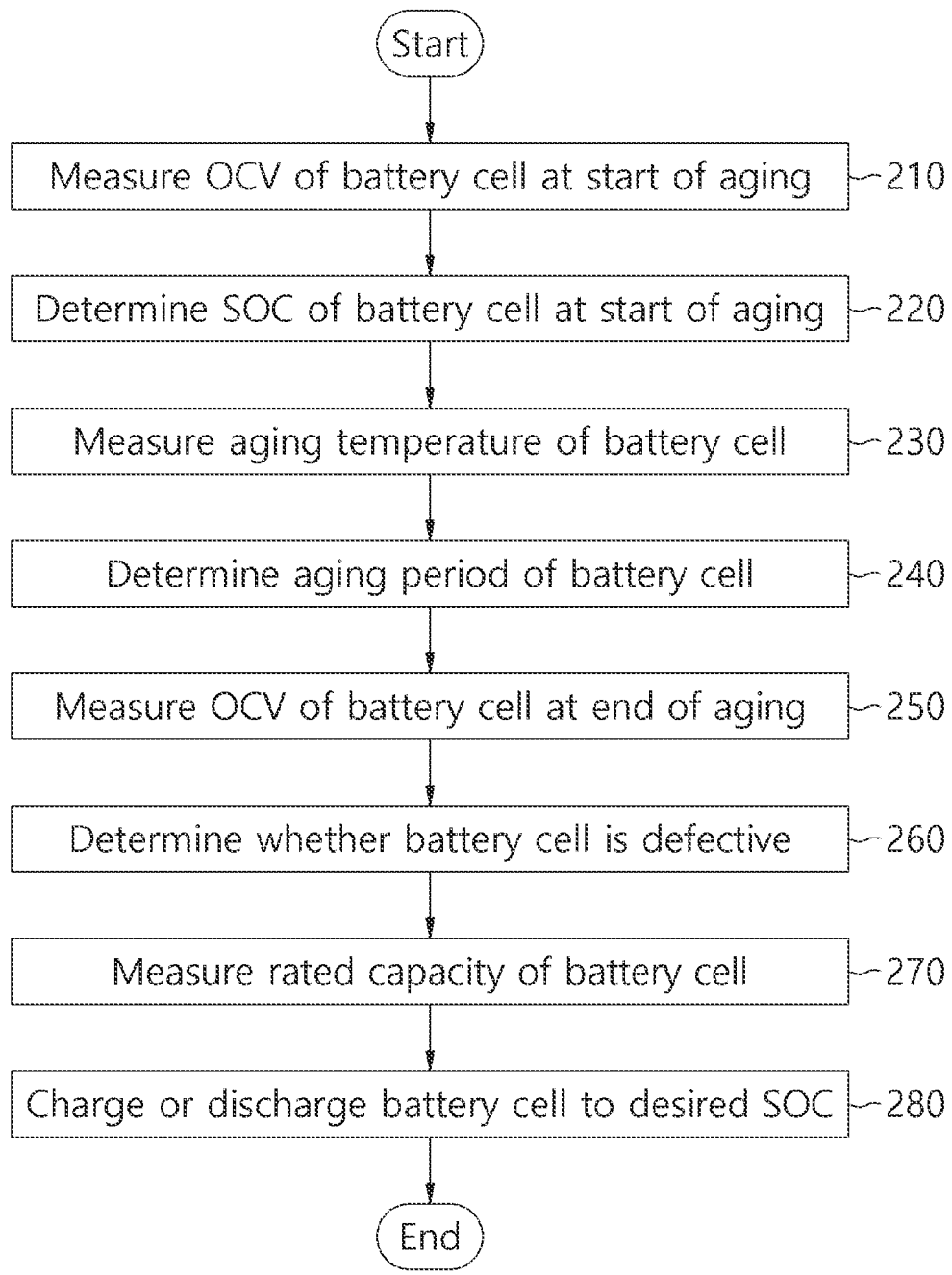

APPARATUS AND METHOD FOR DETERMINING DEFECT OF BATTERY CELL

CROSS-REFERENCE TO RELATED APPLICATIONS

This application claims the priority benefit of Korean Patent Application No. 10-2022-0043029 filed on Apr. 6, 2022, which is incorporated herein by reference for all purposes as if fully set forth herein.

BACKGROUND OF THE INVENTION

1. Field of the Invention

The present invention relates to an apparatus and a method for determining whether a battery cell is defective.

2. Description of the Related Art

In general, a lithium battery is manufactured by the processes of: preparing an electrode assembly including an anode, a cathode and a separation member; housing it in a battery case; and injecting an electrolyte into the electrode assembly. The lithium battery manufactured as described above can function as a battery only when the battery is activated by performing charging and discharging under a predetermined condition. This process is referred to a formation process.

Checking and sorting a defective cell of the lithium battery is being performed in the formation process. However, the formation process generally takes the longest time among the battery production processes, such that reducing the formation process time may be a principal technique and a cost reduction factor for battery manufacturers.

SUMMARY OF THE INVENTION

An object of the present invention is to provide an apparatus and a method for determining a defect of a battery cell, which performs an aging process for inspecting a defective battery cell as a portion of the formation process in a delivery or storage process of the battery cell after shipment.

However, the problem to be solved by the present invention is not limited to the above-described problems, and may be expanded by those skilled in the art in various ways without departing from the technical spirit and scope of the present invention.

To achieve the above object, according to an aspect of the present invention, there is provided an apparatus for determining a defect of a battery cell ("a defect determination apparatus") including: a temperature measurement unit configured to measure an aging temperature of the battery cell; a period determination unit configured to determine an aging period of the battery cell; an SOC determination unit configured to measure and determine a state of charge (SOC) of the battery cell at the start of aging; a voltage measurement unit configured to measure open circuit voltages (OCVs) of the battery cell at the start of aging and at the end of aging; and a defect determination unit configured to determine whether the battery cell is defective based on the aging temperature, the aging period, the SOC at the start of aging, the OCV at the start of aging and the OCV at the end of aging.

The aging of the battery cell may be performed in a delivery or storage process of the battery cell after shipment.

The defect determination unit may determine a defect determination reference voltage based on the aging temperature, the aging period, the SOC at the start of aging and the OCV at the start of aging, and if the OCV at the end of aging is less than the determined defect determination reference voltage, determines that the battery cell is defective.

The defect determination unit may determine the defect determination reference voltage matched with the aging temperature, the aging period, the SOC at the start of aging and the OCV at the start of aging using a pre-established defect determination reference voltage table.

The defect determination unit may calculate a self-discharge voltage and an allowable deviation using the aging temperature, the aging period and the SOC at the start of aging, and calculates the defect determination reference voltage by subtracting the self-discharge voltage and the allowable deviation from the OCV at the start of aging.

The defect determination unit may calculate the self-discharge voltage using an equation below:

$$OCV_{sd} = k \times \frac{e^{l \times (273+T)}}{m} \times (g \times SOC_i^3 + h \times SOC_i^2 + i \times SOC_i + j) \times (d \times \text{duration}^n + f)$$ [Equation]

(wherein, $OCV_{sd}$ is the self-discharge voltage, T is the aging temperature, $SOC_i$ is the SOC at the start of aging, duration is the aging period, and d, f, g, h, i, j, k, l, m and n are coefficients).

The defect determination unit may calculate the allowable deviation using an equation below:

$$OCV_{ad} = a \times c \times e^{b \times T} \times \frac{\tanh(\text{duration})}{0.11 \times SOC_i + 9}$$ [Equation]

(wherein, $OCV_{sd}$ is the allowable deviation, T is the aging temperature, $SOC_i$ is the SOC at the start of aging, duration is the aging period, and a, b and c are coefficients).

The defect determination apparatus may further include a charging/discharging unit configured to measure a rated capacity of the battery cell through a charging/discharging operation, if it is determined that the battery cell is normal.

The defect determination apparatus may further include a charging/discharging unit configured to charge or discharge the battery cell to a desired SOC, if it is determined that the battery cell is normal.

The defect determination apparatus may be implemented in a form of a tray box which stores one or more battery cells.

According to another aspect of the present invention, there is provided a method for determining a detect of a battery cell including the steps, which are performed by a defect determination apparatus, of: measuring an open circuit voltage (OCV) of the battery cell at the start of aging; determining a state of charge (SOC) of the battery cell at the start of aging; measuring an aging temperature of the battery cell; determining an aging period of the battery cell; measuring an OCV of the battery cell at the end of aging; and determining whether the battery cell is defective based on the aging temperature, the aging period, the SOC at the start of aging, the OCV at the start of aging and the OCV at the end of aging.

The aging of the battery cell may be performed in a delivery or storage process of the battery cell after shipment.

The step of determining whether the battery cell is defective may include the steps, which are performed by the defect determination apparatus, of: determining a defect determination reference voltage based on the aging temperature, the aging period, the SOC at the start of aging and the OCV at the start of aging; and if the OCV at the end of aging is less than the determined defect determination reference voltage, determining that the battery cell is defective.

In the step of determining the defect determination reference voltage, the defect determination apparatus may determine the defect determination reference voltage matched with the aging temperature, the aging period, the SOC at the start of aging and the OCV at the start of aging using a pre-established defect determination reference voltage table.

The step of determining of the defect determination reference voltage may include the steps, which are performed by the defect determination apparatus, of: calculating a self-discharge voltage and an allowable deviation using the aging temperature, the aging period and the SOC at the start of aging; and calculating the defect determination reference voltage by subtracting the self-discharge voltage and the allowable deviation from the OCV at the start of aging.

In the step of calculating the self-discharge voltage and the allowable deviation, the defect determination apparatus may calculate the self-discharge voltage using an equation below:

$$OCV_{sd} = k \times \frac{e^{l \times (273+T)}}{m} \times \left(g \times SOC_i^3 + h \times SOC_i^2 + i \times SOC_i + j\right) \times (d \times \text{duration}^n + f) \quad [\text{Equation}]$$

(wherein, $OCV_{sd}$ is the self-discharge voltage, T is the aging temperature, $SOC_i$ is the SOC at the start of aging, duration is the aging period, and d, f, g, h, i, j, k, l, m and n are coefficients).

In the step of calculating the self-discharge voltage and the allowable deviation, the defect determination apparatus may calculate the allowable deviation using an equation below:

$$OCV_{ad} = a \times c \times e^{b \times T} \times \frac{\tanh(\text{duration})}{0.11 \times SOC_i + 9} \quad [\text{Equation}]$$

(wherein, $OCV_{ad}$ is the allowable deviation, T is the aging temperature, $SOC_i$ is the SOC at the start of aging, duration is the aging period, and a, b and c are coefficients).

The method for determining a detect of a battery cell may further include the step of measuring a rated capacity of the battery cell through a charging/discharging operation by the defect determination apparatus, if it is determined that the battery cell is normal.

The method for determining a detect of a battery cell may further include the step of charging or discharging the battery cell to a desired SOC by the defect determination apparatus, if it is determined that the battery cell is normal.

According to various embodiments of the present invention, the aging process for inspecting a defective battery cell as a portion of the formation process may be performed in the delivery or storage process of the battery cell after shipment, thereby reducing manufacturing period and costs of the battery.

In addition, according to various embodiments of the present invention, by calculating and determining a defect determination reference voltage to be used for determining whether a battery cell is defective in consideration of the aging temperature and aging period, it is possible to determine whether a battery cell is defective with high accuracy even if the aging temperature and aging period are variable.

Further, according to various embodiments of the present invention, it is possible to provide the battery cell after measuring the rated capacity at the time of delivering it to the client company, such that selection of good/defective products in terms of capacity may be freed from the storage period and transportation period.

Furthermore, according to various embodiments of the present invention, since charging or discharging to a desired state of charge (SOC) is performed at the time of delivery to the client company, problems that can occur due to an OCV deviation in a battery pack, an energy storage system, etc. for an electric vehicle may be solved.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a block diagram illustrating an apparatus for determining a defect of a battery cell according to an exemplary embodiment; and FIG. 2 is a diagram illustrating a method for determining a defect of a battery cell according to an exemplary embodiment.

DETAILED DESCRIPTION OF THE INVENTION

Hereinafter, embodiments will be described in detail with reference to the accompanying drawings. In denoting reference numerals to components of respective drawings, it should be noted that the same components will be denoted by the same reference numerals although they are illustrated in different drawings. Further, in description of preferred embodiments of the present invention, the publicly known functions and configurations related to the present invention, which are verified to be able to make the purport of the present invention unnecessarily obscure will not be described in detail.

Meanwhile, in respective steps, each of the steps may occur differently from the specified order unless a specific order is clearly described in the context. That is, each of the steps may be performed in the same order as the specified order, may be performed substantially simultaneously, or may be performed in the reverse order.

Further, wordings to be described below are defined in consideration of the functions in the present invention, and may differ depending on the intentions of a user or an operator or custom. Accordingly, such wordings should be defined on the basis of the contents of the overall specification.

It will be understood that, although the terms first, second, etc. may be used herein to describe various components, but these components should not be limited by these terms. These terms are used only to distinguish one component from other components. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In addition, a division of the configuration units in the present disclosure is intended for ease of description and divided only by the main function set for each configuration unit. That is, two or more of the configuration units to be described below may be combined into a single configuration unit or formed by two or more of divisions by function into more than a single configuration unit. Further, each of the configuration units to be described below may additionally perform a part or all of the functions among functions set for other configuration units other than being responsible for the main function, and a part of the functions among the main functions set for each of the configuration units may be exclusively taken and certainly performed by other configuration units.

An apparatus for determining a defect of a battery cell (hereinafter, referred to as a "defect determination apparatus") described in the present disclosure may be an apparatus intended to perform an aging process for inspecting a defective battery cell of the formation process in a delivery or storage process of the battery cell after shipment. For example, the defect determination apparatus may be implemented in a form of a tray box which stores one or more battery cells during the delivery or storage, or may be implemented as a separate device to be mounted in the tray box.

FIG. 1 is a block diagram illustrating a defect determination apparatus according to an exemplary embodiment.

Referring to FIG. 1, a defect determination apparatus 100 according to an exemplary embodiment may include a temperature measurement unit 110, a period determination unit 120, an SOC determination unit 130, a voltage measurement unit 140 and a defect determination unit 150.

The temperature measurement unit 110 may be configured to measure an aging temperature of the battery cell. For example, the temperature measurement unit 110 may measure the aging temperature by periodically measuring a storage temperature of the battery cell at a predetermined time interval during aging of the battery cell.

The period determination unit 120 may determine the aging period of the battery cell.

For example, the period determination unit 120 may include a predetermined timer, thus to determine the aging period of the battery cell using the timer. In this case, an aging start time may be a shipping time or delivery start time, and an aging completion time may be a delivery completion time or a predetermined time before completion of delivery, but they are not limited thereto.

For another example, the period determination unit 120 may be configured to receive an aging start time and an aging completion time from a user through a predetermined input means, and determine the aging period of the battery cell using the received aging start time and aging completion time, which are input from the user.

The SOC determination unit 130 may be configured to measure and determine a state of charge (SOC) of the battery cell at the start of aging. Here, the start of aging may include immediately before and after the start of aging. For example, the SOC determination unit 130 may determine the SOC of the battery cell through a current integration method, an equivalent circuit model method, an electrochemical model method, a data-based method and the like. However, the above-described methods are merely an example, they are not limited thereto, and the SOC determination unit 130 may determine the SOC of the battery cell by various methods known in the art.

The voltage measurement unit 140 may be configured to measure open circuit voltages (hereinafter, "OCVs") of the battery cell at the start of aging and at the end of aging. Here, the end of aging may include immediately before and after end of aging.

The defect determination unit 150 may be configured to determine the defect determination reference voltage to be applied to the battery cell based on the aging temperature, the aging period, the SOC at the start of aging and the OCV at the start of aging.

According to an embodiment, the defect determination unit 150 may determine the defect determination reference voltage to be applied to the battery cell using a pre-established defect determination reference voltage table. Here, the defect determination reference voltage table may be a matching table in which the aging temperature, the aging period, the SOC at the start of aging and the OCV at the start of aging are matched with defect determination reference voltages corresponding to these values. For example, the defect determination reference voltage table may be constructed in advance by calculating the defect determination reference voltage for various values including the aging temperature, the aging period, the SOC at the start of aging and the OCV at the start of aging through Equations 1 to 6 below.

For example, the defect determination unit 150 may determine, from the defect determination reference voltage table, the defect determination reference voltage matched to the aging temperature, the aging period, the SOC at the start of aging and the OCV at the start of aging of the battery cell.

According to another embodiment, the defect determination unit 150 may calculate and determine the defect determination reference voltage through Equations 1 to 6 below.

$$OCV_{rv}=OCV_i-OCV_{sd}-OCV_{ad} \quad \text{[Equation 1]}$$

Wherein, $OCV_{rv}$ may be the defect determination reference voltage, $OCV_i$ may be the OCV at the start of aging, $OCV_{sd}$ may be a self-discharge voltage which is a normally reduced voltage, and $OCV_{ad}$ may be an allowable deviation that can be treated as a normal battery cell.

In addition, $OCV_{sd}$ may be expressed as Equation 2 below, for example.

$$OCV_{sd}=f(T) \times f(SOC_i) \times f(\text{duration}) \quad \text{[Equation 2]}$$

Wherein, T may be the aging temperature, $SOC_i$ may be the SOC at the start of aging, and duration may be an aging period. In this case, T may be an average value.

In addition, f(T) is related to the activation of lithium ions depending on the temperature, and may follow the Arrhenius equation as a relationship between an activation energy and the temperature. For example, f(T) may be expressed as Equation 3 below.

$$f(T) = k \times \frac{e^{l \times (273+T)}}{m} \quad \text{[Equation 3]}$$

Wherein, k, l and m may be coefficients that can be derived from experimental data.

In addition, f(SOC$_i$) is a characteristic of an active material, which may be related to the type of chemical substance and may be expressed as a polynomial. For example, f(SOC$_i$) may be expressed as Equation 4 below.

$$f(SOC_i) = g \times SOC_i^3 + h \times SOC_i^2 + i \times SOC_i + j \qquad \text{[Equation 4]}$$

Wherein, g, h, i and j may be coefficients that can be derived from experimental data.

In addition, f(duration) may be related to the activation of lithium ions over time, and a degree of activation may be decreased over time, but a total amount thereof may follow a power which is continuously increased over time. For example, f(duration) may be expressed as Equation 5 below.

$$f(\text{duration}) = d \times \text{duration}^n + f \qquad \text{[Equation 5]}$$

Wherein, d, n and f may be coefficients that can be derived from experimental data.

In addition, OCV$_{ad}$ may be expressed as Equation 6 below, for example.

$$OCV_{ad} = a \times c \times e^{b \times T} \times \frac{\tanh(\text{duration})}{0.11 \times SOC_i + 9} \qquad \text{[Equation 6]}$$

Wherein, a, b and c may be coefficients that can be derived from experimental data.

When the defect determination reference voltage is determined, the defect determination unit 150 may determine whether the battery cell is defective based on the defect determination reference voltage and the OCV at the end of aging. For example, the defect determination unit 150 compares the OCV at the end of aging with the defect determination reference voltage, and if the OCV at the end of aging is smaller than the defect determination reference voltage, determines that the battery cell is defective, whereas if the OCV at the end of aging is the defect determination reference voltage or more, determines that the battery cell is normal.

In general, the formation process takes the longest time among battery production processes, such that reducing the formation process time may be a principal technique and a cost reduction factor for the battery manufacturers. The defect determination apparatus 100 according to an exemplary embodiment may perform the aging process for inspecting a defective battery cell as a portion of the formation process outside the factory in a delivery or storage process of the battery cell after shipment, such that the battery manufacturing period and costs may be reduced.

The storage temperature of the battery may be variously changed depending on the delivery environment, and the delivery period may also be variously changed depending on locations of the client companies. Therefore, in order to perform the aging process in the delivery process, it is necessary to consider the storage temperature (aging temperature) and the delivery period (aging period) in the delivery process. In this regard, the defect determination apparatus 100 according to an exemplary embodiment calculates and determines the defect determination reference voltage to be used for determining whether a battery cell is defective in consideration of the storage temperature (aging temperature) and the delivery period (aging period), thereby it is possible to determine whether a battery cell is defective with high accuracy even if the storage temperature (aging temperature) and the delivery period (aging period) are variable.

According to an exemplary embodiment, the defect determination apparatus 100 may further include a charging/discharging unit 160 and/or a storage unit 170.

If it is determined that the battery cell is normal, the charging/discharging unit 160 may measure the rated capacity of the battery cell through a charge/discharge operation. For example, the charging/discharging unit 160 may measure the rated capacity of the battery cell by charging the battery cell that has been determined to be normal to SOC 100% and then discharging the battery cell to SOC 10%.

In addition, the charging/discharging unit 160 may charge or discharge the battery cell that has been determined to be normal to the SOC desired by the client company.

The defect determination apparatus 100 according to an exemplary embodiment may provide the battery cell to the client company after measuring the rated capacity thereof by the charging/discharging unit 160, and may deliver the battery cell after charging or discharging to the SOC desired by the client company immediately before delivering it to the client company.

The storage unit 170 may be configured to store programs or commands for an operation of the defect determination apparatus 100, and store data input and processed in the defect determination apparatus 100. For example, the storage unit 170 may store the measured aging temperature, the determined aging period, the determined SOC at the start of aging, the measured OCVs at the start and end of aging, results of determining the defective battery cell, and the measured rated capacity of the battery cell, the defect determination reference voltage table and the like.

The storage unit 170 may include at least one type of storage medium such as a flash memory type, hard disk type, multimedia card micro type or card type memory (e.g., SD or XD memory, etc.), a random access memory (RAM), a static random access memory (SRAM), a read only memory (ROM), an electrically erasable programmable read only memory (EEPROM), a programmable read only memory (PROM), a magnetic memory, a magnetic disk, an optical disk or the like.

FIG. 2 is a diagram illustrating a method for determining a defect of a battery cell (hereinafter, referred to a "defect determination method") according to an exemplary embodiment. The defect determination method of FIG. 2 may be performed by the defect determination apparatus 100 shown in FIG. 1.

Referring to FIG. 2, the defect determination apparatus may measure an OCV of the battery cell at the start of aging (step 210). Here, the start of aging may include immediately before and after the start of aging.

The defect determination apparatus may determine an SOC of the battery cell at the start of aging (step 220). For example, the defect determination apparatus may determine the SOC of the battery cell through a current integration method, an equivalent circuit model method, an electrochemical model method, a data-based method and the like. However, the above-described methods are merely an example, they are not limited thereto, and the defect determination apparatus may determine the SOC of the battery cell by various methods known in the art.

The defect determination apparatus may measure an aging temperature of the battery cell (step 230). For example, the defect determination apparatus may measure the aging temperature by periodically measuring the storage temperature of the battery cell at a predetermined time interval during aging of the battery cell.

The defect determination apparatus may determine an aging period of the battery cell (step 240).

For example, the defect determination apparatus may determine the aging period of the battery cell using a predetermined timer. In this case, the aging start time may be a shipping time or delivery start time, and the aging completion time may be a delivery completion time or a predetermined time before completion of delivery, but they are not limited thereto.

In another example, the defect determination apparatus may receive an aging start time and an aging completion time from a user through the predetermined input means, and determine the aging period of the battery cell using the received aging start time and aging completion time, which are input from the user.

The defect determination apparatus may measure the OCV of the battery cell at the end of aging (step 250). Here, the end of aging may include immediately before and after end of aging.

The defect determination apparatus may determine whether the battery cell is defective using the aging temperature, the aging period, the SOC at the start of aging, and the OCVs at the start and end of aging (step 260).

For example, the defect determination apparatus may calculate and determine the defect determination reference voltage to be applied to the battery cell based on the aging temperature, the aging period, the SOC at the start of aging and the OCV at the start of aging. For example, the defect determination apparatus may calculate and determine the defect determination reference voltage to be applied to the battery cell using the pre-established defect determination reference voltage table or Equations 1 to 6 described above.

When the defect determination reference voltage is determined, the defect determination apparatus may determine whether the battery cell is defective based on the defect determination reference voltage and the OCV at the end of aging. For example, the defect determination apparatus compares the OCV at the end of aging with the defect determination reference voltage, and if the OCV at the end of aging is smaller than the defect determination reference voltage, determines that the battery cell is defective, whereas if the OCV at the end of aging is the defect determination reference voltage or more, determines that the battery cell is normal.

If it is determined that the battery cell is normal, the defect determination apparatus may measure the rated capacity of the battery cell through a charge/discharge operation (step 270). For example, the defect determination apparatus may measure the rated capacity of the battery cell by charging the battery cell that has been determined to be normal to SOC 100% and then discharging the battery cell to SOC 10%.

The defect determination apparatus may charge or discharge the battery cell that has been determined to be normal to the SOC desired by the client company (step 280).

The apparatus described above may be implemented using hardware components, software components, and/or a combination thereof. For example, the apparatus, units and components described in the embodiments may be implemented using one or more general-purpose or special purpose computers, such as a processor, a controller and an arithmetic logic unit (ALU), a digital signal processor, a microcomputer, a field programmable array (FPA), a programmable logic unit (PLU), a microprocessor or any other device capable of executing and responding to instructions, for example. The processing device may execute an operating system (OS) and one or more software applications that are executed on the OS. The processing device also may access, store, manipulate, process, and create data in response to execution of the software. For the convenience of understanding, the description of a processing device is used as singular; however, it will be understood by those skilled in the art that the processing device may include a plurality of processing elements and/or a plurality types of processing elements. For example, the processing device may include a plurality of processors or one processor and one controller. In addition, it is also possible to use different processing configurations such a parallel processor.

Software may include a computer program, a piece of code, an instruction, or at least one combination thereof, and may independently or collectively configure or instruct the processing device so as to be operated as desired. Software and/or data may be embodied permanently or temporarily in any type of machine, component, physical or virtual equipment, computer storage medium or device, or in a propagated signal wave, in order to provide instructions or data to or be interpreted by the processing device. The software also may be distributed computer systems which are connected with each other by a network so that the software is stored or executed in a distributed manner. The software and data may be stored in at least one computer readable recording medium.

The methods according to the above-described embodiments may be implemented in the form of program commands that can be executed through various computer means to be recorded in the computer readable recording medium. The computer readable recording medium may include program commands, data files, data structures, and the like alone or in combination thereof. The program commands recorded in the medium may be specially designed and configured for the above-described embodiments, or may be known to and used by those skilled in the software field. Examples of the computer readable recording medium include magnetic media such as a hard disk, floppy disk and magnetic tape, optical media such as a CD-ROM and DVD, magneto-optical media such as a floppy disk, and a hardware device which is specifically configured to store and perform the program commands such as a ROM, RAM, flash memory or the like. Examples of the program commands include a high-level language code executable by the computer using an interpreter, and the like, as well as a machine language code created by a compiler. The hardware device may be configured to be operated as one or more software modules in order to perform the operations of the above-described embodiments, and an opposite situation thereof is available.

As described above, although the present invention has been described with the limited embodiments and drawings, various modifications and variations are possible by those skilled in the art can from the above description. For example, suitable results may be achieved if the described techniques are performed in an order different from the described method, and/or if the components in the described system, architecture, apparatus, or circuit are coupled or combined in a different manner, or replaced or supplemented by other components or their equivalents.

Therefore, other implementations, other embodiments, and equivalents of the claims are also included in the scope of the claims to be described below.

DESCRIPTION OF REFERENCE NUMERALS

100: Defect determination apparatus
110: Temperature measurement unit
120: Period determination unit
130: SOC determination unit
140: Voltage measurement unit 150: Defect determination unit
160: Charging/discharging unit
170: Storage unit

What is claimed is:

1. An apparatus for determining a defect of a battery cell ("a defect determination apparatus"), the apparatus comprising:
   a temperature measurement unit configured to measure an aging temperature of the battery cell;
   a period determination unit configured to determine an aging period of the battery cell;
   an SOC determination unit configured to measure and determine a state of charge (SOC) of the battery cell at the start of aging;
   a voltage measurement unit configured to measure open circuit voltages (OCVs) of the battery cell at the start of aging and at the end of aging; and
   a defect determination unit configured to determine whether the battery cell is defective based on the aging temperature, the aging period, the SOC at the start of aging, the OCV at the start of aging and the OCV at the end of aging,
   wherein the defect determination unit calculates a self-discharge voltage and an allowable deviation using the aging temperature, the aging period and the SOC at the start of aging,
   calculates the defect determination reference voltage by subtracting the self-discharge voltage and the allowable deviation from the OCV at the start of aging, and
   determines the battery cell is defective when the OCV at the end of aging is less than the determined defect determination reference voltage.

2. The apparatus according to claim 1, wherein the aging of the battery cell is performed in a delivery or storage process of the battery cell after shipment.

3. The apparatus according to claim 1, wherein the defect determination unit determines the defect determination reference voltage matched with the aging temperature, the aging period, the SOC at the start of aging and the OCV at the start of aging using a pre-established defect determination reference voltage table.

4. The apparatus according to claim 1, wherein the defect determination unit calculates the self-discharge voltage using an equation below:

$$OCV_{sd} = k \times \frac{e^{l \times (273+T)}}{m} \times (g \times SOC_i^3 + h \times SOC_i^2 + i \times SOC_i + j) \times (d \times \text{duration}^n + f)$$
[Equation]

(wherein, $OCV_{sd}$ is the self-discharge voltage, T is the aging temperature, $SOC_i$ is the SOC at the start of aging, duration is the aging period, and d, f, g, h, i, j, k, l, m and n are coefficients).

5. The apparatus according to claim 1, wherein the defect determination unit calculates the allowable deviation using an equation below:

$$OCV_{ad} = a \times c \times e^{b \times T} \times \frac{\tanh(\text{duration})}{0.11 \times SOC_i + 9}$$
[Equation]

(wherein, $OCV_{ad}$ is the allowable deviation, T is the aging temperature, $SOC_i$ is the SOC at the start of aging, duration is the aging period, and a, b and c are coefficients).

6. The apparatus according to claim 1, further comprising a charging/discharging unit configured to measure a rated capacity of the battery cell through a charging/discharging operation, if it is determined that the battery cell is normal.

7. The apparatus according to claim 1, further comprising a charging/discharging unit configured to charge or discharge the battery cell to a desired SOC, if it is determined that the battery cell is normal.

8. The apparatus according to claim 1, wherein the defect determination apparatus is implemented in a form of a tray box which stores one or more battery cells.

9. A method for determining a detect of a battery cell, the method comprising the steps, which are performed by a defect determination apparatus, of:
   measuring an open circuit voltage (OCV) of the battery cell at the start of aging;
   determining a state of charge (SOC) of the battery cell at the start of aging;
   measuring an aging temperature of the battery cell;
   determining an aging period of the battery cell;
   measuring an OCV of the battery cell at the end of aging; and
   determining whether the battery cell is defective based on the aging temperature, the aging period, the SOC at the start of aging, the OCV at the start of aging and the OCV at the end of aging,
   wherein the step of determining whether the battery cell is defective comprises the steps, which are performed by the defect determination apparatus, of:
      calculating a self-discharge voltage and an allowable deviation using the aging temperature, the aging period and the SOC at the start of aging, and
      calculating the defect determination reference voltage by subtracting the self-discharge voltage and the allowable deviation from the OCV at the start of aging, and
      determining that the battery cell is defective when the OCV at the end of aging is less than the determined defect determination reference voltage.

10. The method according to claim 9, wherein the aging of the battery cell is performed in a delivery or storage process of the battery cell after shipment.

11. The method according to claim 9, wherein, in the step of determining the defect determination reference voltage, the defect determination apparatus determines the defect determination reference voltage matched with the aging temperature, the aging period, the SOC at the start of aging and the OCV at the start of aging using a pre-established defect determination reference voltage table.

12. The method according to claim 9, wherein, in the step of calculating the self-discharge voltage and the allowable deviation, the defect determination apparatus calculates the self-discharge voltage using an equation below:

$$OCV_{sd} = k \times \frac{e^{l \times (273+T)}}{m} \times (g \times SOC_i^3 + h \times SOC_i^2 + i \times SOC_i + j) \times (d \times \text{duration}^n + f)$$
[Equation]

(wherein, $OCV_{sd}$ is the self-discharge voltage, T is the aging temperature, $SOC_i$ is the SOC at the start of aging, duration is the aging period, and d, f, g, h, i, j, k, l, m and n are coefficients).

13. The method according to claim 9, wherein, in the step of calculating the self-discharge voltage and the allowable deviation, the defect determination apparatus calculates the allowable deviation using an equation below:

$$OCV_{ad} = a \times c \times e^{b \times T} \times \frac{\tanh(\text{duration})}{0.11 \times SOC_i + 9} \quad \text{[Equation]}$$

(wherein, $OCV_{ad}$ is the allowable deviation, T is the aging temperature, $SOC_i$ is the SOC at the start of aging, duration is the aging period, and a, b and c are coefficients).

14. The method according to claim 9, further comprising the step of measuring a rated capacity of the battery cell through a charging/discharging operation by the defect determination apparatus, if it is determined that the battery cell is normal.

15. The method according to claim 9, further comprising the step of charging or discharging the battery cell to a desired SOC by the defect determination apparatus, if it is determined that the battery cell is normal.

* * * * *